United States Patent
Redman-White

(10) Patent No.: US 7,536,165 B2
(45) Date of Patent: May 19, 2009

(54) OFFSET CORRECTION FOR DOWN-CONVERSION MIXERS

(75) Inventor: William Redman-White, Los Gatos, CA (US)

(73) Assignee: NXP B.V., Eindhoven (NL)

( * ) Notice: Subject to any disclaimer, the term of this patent is extended or adjusted under 35 U.S.C. 154(b) by 606 days.

(21) Appl. No.: 10/202,035

(22) Filed: Jul. 24, 2002

(65) Prior Publication Data

US 2004/0017862 A1  Jan. 29, 2004

(51) Int. Cl.
  *H04B 1/24* (2006.01)
(52) U.S. Cl. .......................... 455/333; 455/318
(58) Field of Classification Search .................. 455/305, 455/333, 324, 317, 318, 319, 323
  See application file for complete search history.

(56) References Cited

U.S. PATENT DOCUMENTS

| | | | |
|---|---|---|---|
| 5,241,702 A | | 8/1993 | Dent |
| 5,613,233 A | * | 3/1997 | Vagher ........................ 455/296 |
| 5,809,410 A | * | 9/1998 | Stuebing et al. ............. 455/333 |
| 5,918,167 A | * | 6/1999 | Tiller et al. .................. 455/310 |
| 5,933,771 A | * | 8/1999 | Tiller et al. .................. 455/333 |
| 6,006,081 A | * | 12/1999 | Moore .......................... 455/326 |
| 6,009,317 A | * | 12/1999 | Wynn .......................... 455/296 |
| 6,148,047 A | | 11/2000 | Mohindra |
| 6,340,883 B1 | * | 1/2002 | Nara et al. ................ 324/76.78 |
| 6,393,260 B1 | * | 5/2002 | Murtojarvi et al. ............ 455/91 |
| 6,535,725 B2 | * | 3/2003 | Hatcher et al. .............. 455/317 |

FOREIGN PATENT DOCUMENTS

| | | |
|---|---|---|
| EP | 0 594 894 B1 | 3/1999 |
| EP | 0 964 557 A1 | 12/1999 |

* cited by examiner

*Primary Examiner*—Edward Urban
*Assistant Examiner*—Adeel Haroon
(74) *Attorney, Agent, or Firm*—Lisa K. Jorgenson; E. Russell Tarleton; Seed IP Law Group PLLC

(57) ABSTRACT

A direct conversion receiver includes a detector that provides a measure of bias offset that is caused by component mismatches in the direct conversion mixer, and a corrective network that reduces the bias offset based on this measure. The direct conversion mixer demodulates a radio-frequency (RF) input signal via mixing with a local-oscillator (LO) signal to provide a differential baseband output signal. A differential peak detector compares the peak signal value at each side of the mixer's differential output, and a differential integrator averages the difference between these peak signal values to provide the measure of bias offset. The corrective network adds a correction offset to each of the local oscillator local oscillator paths on each of the switching pairs that provide the differential output, but opposite to the local oscillator connections. By applying the correction offset to the opposing transistor in each pair, the difference in switching time between the pairs is reduced, and, correspondingly, the differential-mode leakage from the local oscillator to the RF input stage is reduced.

14 Claims, 2 Drawing Sheets

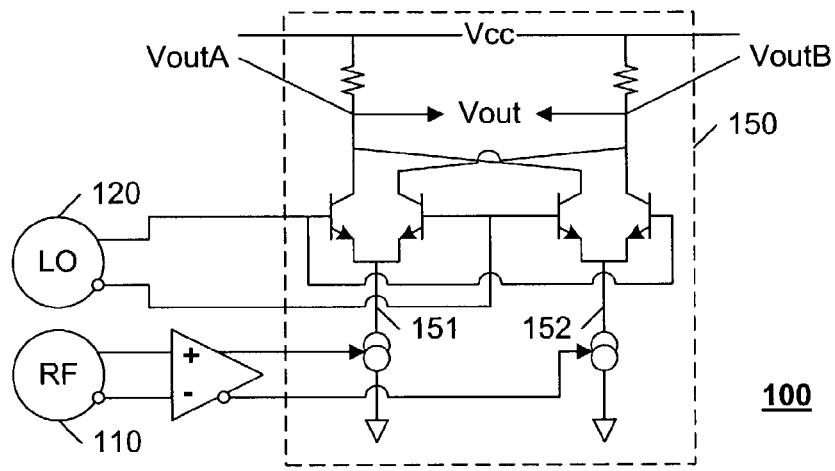
FIG. 1 [Prior Art]
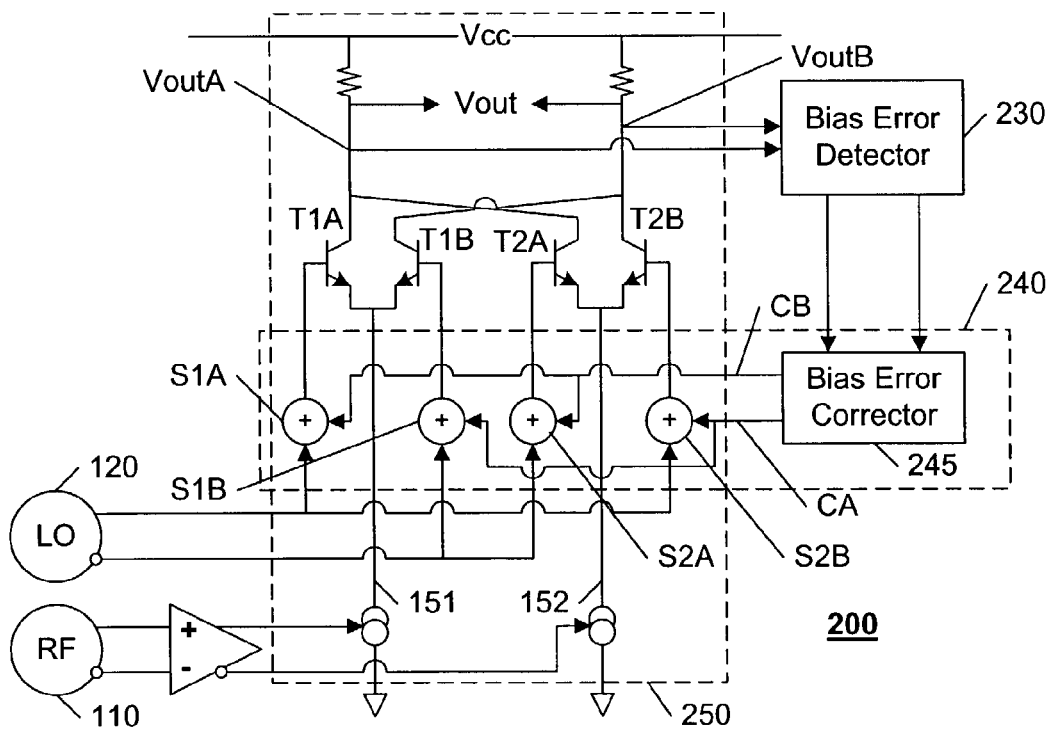
FIG. 2

OFFSET CORRECTION FOR DOWN-CONVERSION MIXERS

BACKGROUND OF THE INVENTION

1. Field of the Invention

This invention relates to the field of communications, and in particular to a switching and bias correction system for direct conversion receivers.

2. Description of Related Art

Direct conversion receivers are commonly used in wireless communication devices, such as cellular telephones. A particular concern in the design of such devices is the interference that each device may cause to each other device in a local environment. For example, in a direct conversion receiver, wherein a local oscillator (LO) signal is mixed directly with the received radio-frequency (RF) signal, leakage from the local oscillator is easily communicated to the RF antenna, and can interfere with other signals in the vicinity of the antenna.

FIG. 1 illustrates an example schematic of a prior art direct conversion receiver system 100. As illustrated, a mixer 150 demodulates an RF signal 110 via a local oscillator 120 to produce a baseband output Vout. Ideally, if the complementary outputs of the local oscillator 120 are true inversions of each other, if the transistors and load resistors are matched, and if the input transconductance is ideally balanced, there will be no leakage of the local oscillator 120 into the RF signal 110. To minimize noise sensitivity and to further minimize the propagation of the local oscillator signal 120 to the RF signal 110, differential circuits are used throughout, thereby cancelling the common-mode leakage or noise.

If the complementary outputs, or phases, of the local oscillator 120 are not truly complementary of each other, the switching points of the transistors in the mixer 150 will differ, and a difference signal at the local oscillator frequency will be created. Although this difference signal is a common-mode signal, an imbalance of the input transconductance at the tail nodes 151, 152 will transform this common-mode signal to a differential-mode signal, which will be propagated back to the RF signal 110, and possibly emanated from the RF antenna at the local oscillator frequency.

Even with true complementary outputs of the local oscillator 120, random mismatches of component values within the mixer 150 may affect the DC offset of one or more of the transistors, such that the crossover points in the individual transistor pairs is offset from the instant where the complementary outputs of the local oscillator 120 cross. Such an offset will produce a mark:space ratio that is no longer 1:1, and the signals at the tail nodes 151, 152 will not be matched. This mismatch will produce a differential-mode signal at the local oscillator frequency that is propagated to the RF signal 110, and possibly emanated from the RF antenna, regardless of the balance of the input transconductance at the tail nodes 151, 152.

BRIEF SUMMARY OF THE INVENTION

It is an object of this invention to reduce the amount of leakage in a local oscillator of a direct conversion receiver. It is a further object of this invention to transform residual leakage in the local oscillator to common-mode leakage.

These and other objects of the invention are achieved by a direct conversion receiver that includes a detector that provides a measure of bias offset that is caused by component mismatches in the direct conversion mixer, and a corrective network that reduces the bias offset based on this measure. The direct conversion mixer demodulates a radio-frequency (RF) input signal via mixing with a local-oscillator (LO) signal to provide a differential baseband output signal. A differential peak detector compares the peak signal value at each side of the mixer's differential output, and a differential integrator averages the difference between these peak signal values to provide the measure of bias offset. The corrective network adds a correction offset to each of the local oscillator local oscillator paths on each of the switching pairs that provide the differential output, but opposite to the local oscillator connections. By applying the correction offset to the opposing transistor in each pair, the difference in switching time between the pairs is reduced, and, correspondingly, the differential-mode leakage from the local oscillator to the RF input stage is reduced.

BRIEF DESCRIPTION OF THE DRAWINGS

The invention is explained in further detail, and by way of example, with reference to the accompanying drawings wherein:

FIG. 1 illustrates an example schematic of a prior art direct conversion receiver.

FIG. 2 illustrates an example schematic of a direct conversion receiver with bias-offset correction in accordance with this invention.

Throughout the drawings, the same reference numerals indicate similar or corresponding features or functions.

DETAILED DESCRIPTION OF THE INVENTION

Figure 3:
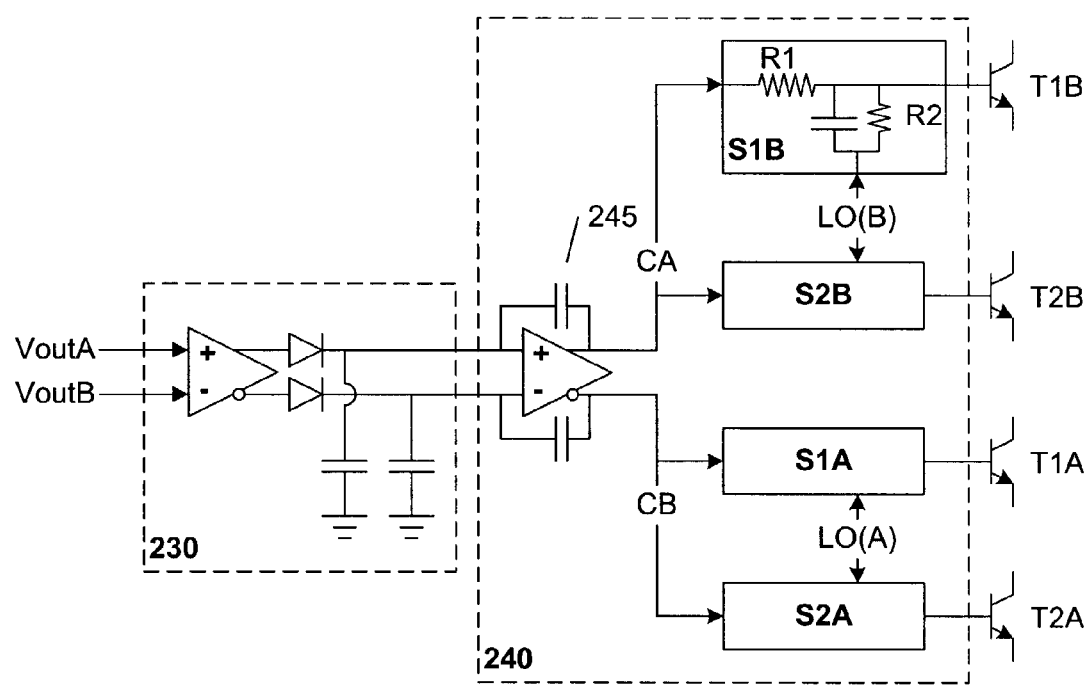
FIG. 3 illustrates an example schematic of a bias error detector and corrective network in accordance with this invention.

FIG. 2 illustrates an example schematic of a direct conversion receiver 200 with bias-offset correction in accordance with this invention. The receiver 200 includes a mixer 250, corresponding to the mixer 150 of the prior art FIG. 1, with the addition of a corrective network 240 that adjusts the bias levels of the mixing transistors T1A, T1B, T2A, and T2B to minimize the effects of component variations in the mixer 250.

In an ideal embodiment of a differential direct conversion receiver such as illustrated in FIG. 1, the input RF signal is alternately mixed with symmetric half-cycles of the local oscillator, each half cycle being processed by alternate transistors in each differential branch of the mixer. Because of the symmetric structure and processing in the ideal mixer, each side, or phase, VoutA and VoutB, of the differential voltage output Vout will exhibit equal and opposite signal excursions about a common DC level. Component variations in the mixer that affect the bias of the transistors will shift the crossover points in the individual transistor pairs, and cause an imbalance within the transistor pair and/or between the transistor pairs. For ease of reference, the term imbalance is used hereinafter to refer to responses that differ from the symmetric responses of an ideal mixer.

This invention is premised on the observation that imbalances caused by component variations in a mixer cause an imbalance between the phases of the differential output of a direct conversion mixer, and a measure of the imbalance at the differential output can be used to correct the mixer for such imbalances.

As illustrated in FIG. 2, a bias-error detector 230 detects the imbalance within the opposing phases VoutA and VoutB of the differential output Vout. The detected imbalance is provided to a bias error corrector 245 in the corrective network 240, to provide correction signals CA and CB for adjusting the bias of each of the transistors T1A, T1B, T2A, and T2B.

The correction signals CA and CB are directly correlated to the imbalance of VoutA and VoutB, respectively. As illustrated, the correction signals CA, CB are applied in opposition to the local oscillator 120. That is, correction signal CA is applied to transistors T1B and T2B, to affect VoutB, and correction signal CB is applied to transistors T1A and T2A, to affect VoutA. By applying the correction in opposition to the local oscillator 120, the difference in switching time between the pairs T1A-T1B and T2A-T2B is reduced, and, correspondingly, the differential-mode leakage from the local oscillator to the RF input stage is reduced.

FIG. 3 illustrates an example schematic of a bias error detector 230 and corrective network 240 in accordance with this invention, although other techniques for detecting an imbalance within and between each phase of a differential output pair, VoutA and VoutB, and for providing a correction signal CA, CB to the mixer 250 to compensate for the imbalance will be evident to one of ordinary skill in the art in view of this disclosure.

The example bias error detector 230 comprises a differential amplifier, to eliminate the common DC potential of the differential output pair, followed by a pair of rectifier-capacitors, to form a peak-detector pair for measuring the peak excursion of each phase of the differential output pair relative to the common DC potential. In an ideal mixer, the peak excursions of VoutA and VoutB about the common DC potential will be equal; in a non-ideal mixer, component variations will cause the peak values to differ. The corrective network 240 includes a differential integrator 245 that averages the differences between the peak values to produce the correction values CA, CB. The summing devices S1A, S1B, S2A, and S2B add the correction values CB, CA to the opposing local oscillator signals LO(A), LO(B) to adjust the bias of the corresponding transistors T1A, T1B, S2A, and S2B, respectively.

FIG. 3 also illustrates an example summing device S1B. The correction signal is applied via a large resistor R1, relative to a smaller resistor R2 in the local oscillator path. In this manner, the resistor R2 sets the common-mode bias, while the resistor R1 modifies the bias based on the unbalance between the phases of the differential output Vout. To facilitate effective AC-coupling, the local oscillator is also capacitively coupled to the mixing transistor.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

I claim:

1. A direct conversion receiver comprising:
   a mixer that is configured to receive a differential radio-frequency signal and a differential local oscillator signal to produce therefrom a differential output signal,
   a differential bias error detector, operably coupled to the mixer, that is configured to receive the differential output signal from the mixer and to produce therefrom a measure of imbalance of a phase of the differential output signal, and
   a bias error corrective network, operably coupled to the bias error detector and the mixer that is configured to apply a differential corrective signal to the mixer to reduce the measure of imbalance of the phase of the differential output signal, the differential corrective signal comprising a first correction signal and a second correction signal applied to the mixer in opposition to the local oscillator to transform residual leakage in the local oscillator to common-mode leakage.

2. The direct conversion receiver of claim 1, wherein the bias error detector includes a differential peak detector that comprises a differential amplifier followed by a pair of rectifier capacitors configured to form a peak detector pair to detect peak signal values corresponding to each phase of the differential output signal, the measure of imbalance being dependent upon a difference between the peak signal values.

3. The direct conversion receiver of claim 2, wherein the corrective network includes a differential integrator that is configured to average the peak signal values corresponding to each phase of the differential output signal to produce first and second differential correction signals.

4. The direct conversion receiver of claim 1, wherein the corrective network includes a differential integrator that is configured to average the measure of imbalance of the differential output signal and a summing circuit that couples to the mixer the output of the differential integrator and that capacitively couples the differential local oscillator signal to the mixer.

5. A mixer for combining a local-oscillator signal with a radio-frequency signal to provide a baseband output signal, comprising:
   a first transistor pair that includes:
      a first transistor having:
         a base that receives a first bias input that is dependent upon a first phase of the local-oscillator signal and a first correction signal,
      a collector that is coupled to a first phase of the baseband output signal, and
      an emitter that is coupled to a first phase of the radio-frequency signal;
      a second transistor having:
      a base that receives a second bias input that is dependent upon a second phase of the local-oscillator signal and a second correction signal, and
      a collector that is coupled to a second phase of the baseband output signal, and
      an emitter that is coupled to the first phase of the radio-frequency signal;
   and a second transistor pair that includes:
      a third transistor having:
         a base that receives a third bias input that is dependent upon the second phase of the local-oscillator signal and the first correction signal,
         a collector that is coupled to the first phase of the baseband output signal, and
         an emitter that is coupled to a second phase of the radio-frequency signal;
      a fourth transistor having:
         a base that receives a fourth bias input that is dependent upon the first phase of the local-oscillator signal and the first correction signal,
         a collector that is coupled to the second phase of the baseband output signal, and
         an emitter that is coupled to the second phase of the radio-frequency signal;
   wherein:
      the second correction signal is based a first measure of imbalance corresponding to the first phase of the baseband output signal,
      the first correction signal is based on a second measure of imbalance corresponding to the second phase of the baseband output signal; and the first and second correction signals form a differential correction signal.

6. The mixer of claim 5, further including:
a first current generator that controls current through the emitters of the first and second transistors, based on the first phase of the radio-frequency signal; and
a second current generator that controls current through the emitters of the third and fourth transistors, based on the second phase of the radio-frequency signal.

7. The mixer of claim 5, further including
a differential peak detector that is configured to provide:
a first peak signal corresponding to a peak excursion of the first phase of the baseband output signal, and
a second peak signal corresponding to a peak excursion of the second phase of the baseband output signal,
wherein
the first measure of imbalance is based on the first peak signal, and
the second measure of imbalance is based on the second peak signal.

8. The mixer of claim 7, further including
an integrator that is configured to provide
the first measure of imbalance corresponding to an average of the first peak signal, and
the second measure of imbalance corresponding to an average of the second peak signal.

9. A method of reducing leakage from a direct conversion mixer, comprising: using a differential circuit including a differential amplifier to differentially measure a degree of phase imbalance associated with an output signal of the direct conversion mixer, and using a differential circuit including a differential amplifier to differentially adjust a bias point of one or more switching devices in the direct conversion mixer based on the degree of imbalance, wherein residual leakage in a local oscillator coupled to the mixer is transformed from residual leakage to common-mode leakage.

10. The method of claim 9, wherein the output signal of the direct conversion mixer is a differential signal having a first phase and a second phase, and measuring the degree of imbalance includes: measuring an imbalance associated with the first phase, and measuring an imbalance associated with the second phase.

11. The method of claim 10, wherein adjusting the bias point includes adjusting a bias point of one or more first switching devices that control the first phase, based on the imbalance associated with the second phase, and adjusting a bias point of one or more second switching devices that control the second phase based on the imbalance associated with the first phase.

12. The method of claim 10, wherein measuring the imbalance associated with the first phase and the second phase includes measuring peak excursions of the first phase and the second phase.

13. The method of claim 9, wherein measuring the degree of imbalance includes measuring a peak excursion of the output signal.

14. The method of claim 9, wherein the differential amplifier includes
(1) a first transistor pair that includes:
a first transistor in which a base receives a first bias input that is dependent upon a first phase of a local-oscillator signal and a first correction signal, a collector that is coupled to a first phase of a baseband output signal, and an emitter that is coupled to a first phase of a radio-frequency signal;
a second transistor in which a base receives a second bias input that is dependent upon a second phase of the local-oscillator signal and a second correction signal, and
a collector that is coupled to a second phase of the baseband output signal, and
an emitter that is coupled to the first phase of the radio-frequency signal; and
(2) a second transistor pair that includes:
a third transistor in which a base receives a third bias input that is dependent upon the second phase of the local-oscillator signal and the first correction signal,
a collector that is coupled to the first phase of the baseband output signal, and an emitter that is coupled to a second phase of the radio-frequency signal;
a fourth transistor in which a base receives a fourth bias input that is dependent upon the first phase of the local-oscillator signal and the first correction signal,
a collector that is coupled to the second phase of the baseband output signal, and
an emitter that is coupled to the second phase of the radio-frequency signal;
wherein:
the second correction signal is based a first measure of imbalance corresponding to the first phase of the baseband output signal,
the first correction signal is based on a second measure of imbalance corresponding to the second phase of the baseband output signal; and
the first and second correction signals form a differential correction signal.

* * * * *